US 6,566,195 B2

(12) United States Patent
Rudeck

(10) Patent No.: US 6,566,195 B2
(45) Date of Patent: May 20, 2003

(54) METHOD AND STRUCTURE FOR AN IMPROVED FLOATING GATE MEMORY CELL

(75) Inventor: Paul J. Rudeck, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/068,198

(22) Filed: Feb. 6, 2002

(65) Prior Publication Data

US 2002/0081805 A1 Jun. 27, 2002

Related U.S. Application Data

(62) Division of application No. 09/388,287, filed on Sep. 1, 1999.

(51) Int. Cl.[7] ............................................. H01L 21/336
(52) U.S. Cl. ...................................... 438/257; 257/315
(58) Field of Search ................................ 438/257, 594, 438/221, 260, 296; 365/185; 257/315–317

(56) References Cited

U.S. PATENT DOCUMENTS

| 5,557,122 A | * | 9/1996 | Shrivastava et al. | ......... 257/309 |
| 5,767,005 A | | 6/1998 | Doan et al. | ................. 438/593 |
| 6,117,756 A | | 9/2000 | Wu | ............................. 438/594 |
| 6,127,227 A | * | 10/2000 | Lin et al. | .................... 438/261 |
| 6,200,856 B1 | | 3/2001 | Chen | .......................... 438/257 |

OTHER PUBLICATIONS

Peters, L., "Choices and Challenges for Shallow Trench Isolation", *Semiconductor International, Research and Development*, http://www.semiconductor.net/semiconductor/archive/Apr99/docs/feature2.html, 6 pages, (Apr. 1999).
Shimizu, K., et al., "A Novel High–Density 5F NAND F STI Cell Technology Suitable for 256Mbit and 1Gbit Flash Memories", *IEEE*, 271–274, (1997).

* cited by examiner

*Primary Examiner*—David Nelms
*Assistant Examiner*—David Vu
(74) *Attorney, Agent, or Firm*—Schwegman, Lundberg, Woessner & Kluth, P.A.

(57) ABSTRACT

A method and structure for an improved floating gate memory cell are provided. The non volatile memory cell includes a substrate and a first insulating layer formed on the substrate. The memory cell also includes a shallow trench isolation (STI) region having walls that form edges in the substrate and edges to a first conducting layer where the edges of the first conducting layer are aligned with the edges of the substrate. The memory cell further includes a second insulating layer formed on the first conducting layer and a second conducting layer formed on the first insulating layer. The invention also includes a method that capitalizes on a single step process for defining the STI region and the floating gate for a memory cell that aligns edges formed in the substrate by the walls of the STI region with the edges of the floating gate formed by the walls of the STI region. Arrays, memory devices, and systems are further included in the scope of the present invention.

32 Claims, 13 Drawing Sheets

METHOD AND STRUCTURE FOR AN IMPROVED FLOATING GATE MEMORY CELL

RELATED APPLICATIONS

This application is a Divisional of U.S. Ser. No. 09/388,287 filed on Sep. 1, 1999, which is incorporated herein by reference.

FIELD OF THE INVENTION

The present invention relates generally to semiconductor integrated circuits. More particularly, it pertains to a method and structure for an improved floating gate memory cell.

BACKGROUND OF THE INVENTION

Modem integrated circuit technology relies on transistors and memory cells to formulate vast arrays of functional circuits. The complexity of these circuits requires the use of an ever increasing number of linked transistors and memory cells. As the number of transistors and memory cells required increases, the surface area that can be dedicated to a single component dwindles. Today, also, high reliability is needed in each component to reduce the amount of redundancy needed to guarantee proper operation. Additionally, it is desired to have uniformity among memory cells to facilitate uniform erasure and avoid charge leakage for such memory devices. Thus, it is desirable to construct integrated circuit components which have higher reliability and greater uniformity that can accommodate higher density arrangement on the surface of the silicon chip.

Non volatile floating gate tunneling oxide (FLOTOX) devices, i.e. FLOTOX transistors, offer the prospect of very high density memory cell structures. Flash memories are one form of FLOTOX devices and electronically erasable and programmable read only memories (EEPROMs) are another. Due to their high density nature, memories formed with FLOTOX transistors have the potential of replacing hard storage disk drives in computer systems. The advantages to this substitution would be in replacing a complex and delicate mechanical system with a rugged and easily portable small solid-state non-volatile memory system. There is also the possibility that given more speed of operation, particularly in the erase operation, that FLOTOX transistors might be used to replace dynamic random access memories (DRAMs). Thus, FLOTOX transistors might eventually have the ability to fill all memory needs in future computer systems.

In operation, FLOTOX transistors can be electronically programmed, erased, and reprogrammed. In FLOTOX transistors a floating gate is electrically isolated and any charge stored on the floating gate is trapped. Storing sufficient charge on the floating gate will make it more difficult to form an inversion channel between the source and drain of the FLOTOX transistor. Thus, the presence or absence of charge on the floating gate represents two distinct data states.

Typically, FLOTOX transistors are selectively programmed, or "written to," by hot electron injection which places a charge on a floating gate during a write. The FLOTOX transistors are selectively erased by Fowler-Nordheim tunneling which removes the charge from the floating gate. During a write, a high programming voltage is placed on a control gate. This forces an inversion region to form in the p-type substrate. The drain voltage is increased to approximately half the control gate voltage while the source is grounded, increasing the voltage drop between the drain and source. In the presence of the inversion region, the current between the drain and source increases. The resulting high electron flow from source to drain increases the kinetic energy of the electrons. This causes the electrons to gain enough energy to overcome the outside barrier and collect on the floating gate.

After the write is completed, the negative charge on the floating gate raises the transistor's threshold voltage ($V_T$) above the wordline logic 1 voltage. When a written transistor's wordline is brought to a logic 1 during a read, the transistors will not turn on. Sense amplifiers detect and amplify the transistor current, and output a logic 0 for a written transistor.

The floating gate can be unprogrammed, or "erased," by grounding the control gate and raising the source voltage to a sufficiently high positive voltage to transfer electrons out of the floating gate to the source terminal of the transistor by tunneling through the insulating gate oxide. After the erase is completed, the lack of charge on the floating gate lowers the cell's $V_T$ below the wordline logic 1 voltage. Thus when an erased cell's wordline is brought to a logic 1 during a read, the transistor will turn on and conduct more current than a written cell. Some flash devices use Fowler-Nordheim tunneling for write as well as erase.

One of the present hurdles in reducing the size of the FLOTOX transistor is related to the creation of the floating polysilicon gate and the shallow trench isolation region between adjacent FLOTOX transistors. Typically, the shallow trench isolation and the floating polysilicon gate are defined using two different lithography masks. Because of potential errors in the alignment of these two layers, the cell design must include extra area for the overlap of the floating polysilicon gate with the shallow trench isolation. In addition, the process steps required to form the shallow trench isolation, along with the processing steps between the formation of the shallow trench isolation region and the growth of the tunnel oxide/deposition of the floating polysilicon gate, create the potential for the thinning of the tunnel oxide.

Thinning of the tunnel oxide can lead to at least two performance problems. A first problem is erase uniformity. Flash memory is not erased on a cell by cell basis, but rather on a block by block basis. Because a large number of cells are erased at the same time, it is important that all of the cells within each block erase at close to the same rate. Any variation in field edge thinning will increase the cell to cell erase distribution. A second problem is data retention. The thinning of the tunnel oxide, at the field edges, can create localized tunneling at the these regions. Because of the higher fields and density of charge during erase, in these regions, long term data retention can become a problem.

Another problem arises when the device size is reduced, the gate coupling ratio (GCR) decreases. The surface area of the two gates is reduced when the overall size of the device is reduced. The GCR is a factor of the surface area of the two gates and is thereby decreased as the surface area of the gates diminishes. In order to overcome this loss in GCR, the periphery transistors must operate at higher voltage levels. If the loss of gate coupling is large enough, this may require the periphery transistors to operatate near their breakdown levels.

One method used to recover surface area lost as the overall device size is reduced is described in "A Novel High-Density 5F2 NAND STI Cell Technology Suitable for 256 Mbit and 1 Gbit Flash Memories", K. Shimizu, K. Narita, H. Watanabe, E. Kamiya, T. Yaegashi, S. Aritome and T. Watanabe, 1997 IEDM 271–274. The method used was to 1) deposit a second polysilicon layer over the first polysilicon film, 2) a thin layer of silicon-nitride is then deposited over the second polysilicon layer, 3) a lithography level is then used to pattern the silicon nitride film only, 4) a second layer of silicon nitride is then deposited over the patterned silicon nitride film, 5) the second layer of silicon nitride next receives a blanket directional etch to form $2^{nd}$ layer silicon nitride spacers on the patterned edges of the $1^{st}$ layer of silicon nitride, 6) the final silicon nitride structure is than used as an etch mask to etch/remove the second polysilicon film over the shallow trench isolation, and 7) the silicon nitride mask is removed. The final outcome of all of the above processing is the addition of an extension over a certain percent of the shallow trench isolation. This process allows for very small gaps between the floating polysilicon gate, cell to cell. This leads to an increase in surface area between the floating gate and the control gate, with no increase in surface area between floating gate and the silicon substrate. The net result is increased coupling of the control gate to the floating gate. The problem with this approach is that the process becomes very complex. The process requires two additional silicon-nitride depositions, one additional lithography step, two additional silicon-nitride etch steps, one additional polysilicon etch step and finally the removal of the silicon-nitride mask.

Thus, what is needed is a method and apparatus for creating integrated circuit components which have higher reliability and greater uniformity and that can accommodate a higher density arrangement on the surface of the silicon chip without a loss in gate coupling ratio and with a simplified fabrication process.

For the reasons stated above, and for other reasons stated below which will become apparent to those skilled in the art upon reading and understanding the present specification, it is desirable to develop a method and structure for improved FLOTOX transistors.

SUMMARY OF THE INVENTION

The above mentioned problems with non volatile FLOTOX transistors and other problems are addressed by the present invention and will be understood by reading and studying the following specification. A method and structure for an improved floating gate memory cell are provided. The present invention capitalizes on a single step process for defining a shallow trench isolation (STI) region and floating gate that aligns the edges of each with the other. This alignment allows for a significant reduction in the size of each memory cell that correspondingly increases the density of memory cells in a particular area of a memory system. The alignment also facilitates an improved edge profile of the floating gate polysilicon that correspondingly increases data retention due to the elimination of localized tunneling at the field isolation edge. Additionally, the alignment provides for greater erase uniformity by reducing variations due to tunnel oxide thinning at the edge of the field isolation uniformity.

The present invention also employs techniques to increase the area of the top side of the floating gate. The area increase is needed to compensate for the loss in area due to the reduced size of the memory cell that correspondingly reduces the gate coupling ratio (GCR) between the floating gate and the control gate. The techniques include using hemispherical grain (HSG) polysilicon or wings on the top surface of the floating gate. Either HSG polysilicon or wings will increase the surface area of the top side of the floating gate. The increased area maintains or improves the GCR between the floating gate and the control gate of the memory cell, thus, allowing the memory cell to function at reasonable signal levels.

In particular, one embodiment of the present invention includes a non volatile memory cell. The non volatile memory cell includes a substrate and a first insulating layer formed on the substrate. The memory cell also includes a shallow trench isolation region having walls that form an edge in the substrate and a first conducting layer having an edge and formed on the first insulating layer where the edge of the first conducting layer is aligned with the edge of the substrate formed by the walls of the shallow trench isolation region. The memory cell further includes a second insulating layer formed on the first conducting layer and a second conducting layer formed on the first insulating layer.

In another embodiment of the present invention, a method for forming a non volatile memory cell is provided. The method includes forming a tunnel oxide layer on a substrate. Forming a first conducting layer on the tunnel oxide layer having an edge. Forming a shallow trench isolation region having walls that form edges in the substrate such that the edge of the first conducting layer is aligned with one of the edges of the substrate and where the shallow trench isolation region isolates the non volatile memory cell. Forming an insulating layer on the first conducting layer and forming a second conducting layer on the insulating layer.

These and other embodiments, aspects, advantages, and features of the present invention will be set forth in part in the description which follows, and in part will become apparent to those skilled in the art by reference to the following description of the invention and referenced drawings or by practice of the invention. The aspects, advantages, and features of the invention are realized and attained by means of the instrumentalities, procedures, and combinations particularly pointed out in the appended claims.

BRIEF DESCRIPTION OF THE DRAWINGS

FIGS. 5A–D, 5E-1, 5E-2, and 5F illustrate an embodiment of a process of fabrication for a non volatile floating gate tunneling oxide (FLOTOX) transistor according to the teachings of the present invention.

DETAILED DESCRIPTION

Figure 1A:
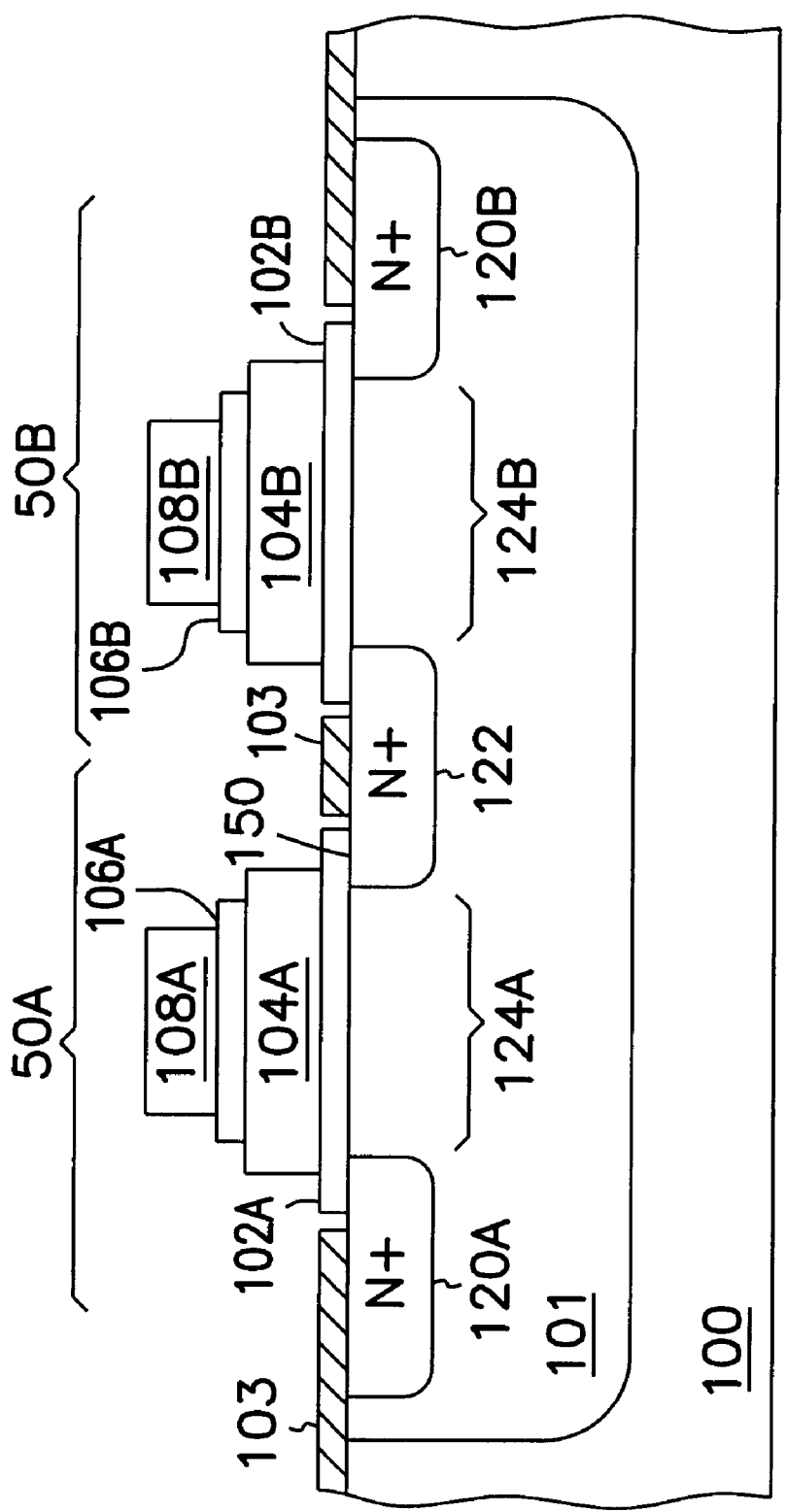
FIG. 1A is a cross-sectional view taken illustrating non-volatile floating gate tunneling oxide (FLOTOX) transistor taken along cut line 1A—1A of FIG. 2 according to the teachings of the present invention.

In the following detailed description of the invention, reference is made to the accompanying drawings which form a part hereof, and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention.

The terms wafer and substrate used in the following description include any structure having an exposed surface with which to form the integrated circuit (IC) structure of the invention. The term substrate is understood to include semiconductor wafers. The term substrate is also used to refer to semiconductor structures during processing, and may include other layers that have been fabricated thereupon. Both wafer and substrate include doped and undoped semiconductors, epitaxial semiconductor layers supported by a base semiconductor or insulator, as well as other semiconductor structures well known to one skilled in the art. The term conductor is understood to include semiconductors, and the term insulator is defined to include any material that is less electrically conductive than the materials referred to as conductors. The following detailed description is, therefore, not to be taken in a limiting sense, and the scope of the present invention is defined only by the appended claims, along with the fall scope of equivalents to which such claims are entitled.

The term "horizontal" as used in this application is defined as a plane parallel to the conventional plane or surface of a wafer or substrate, regardless of the orientation of the wafer or substrate. The term "vertical" refers to a direction perpendicular to the horizonal as defined above. Prepositions, such as "on", "upper," "side" (as in "sidewall"), "higher," "lower," "over" and "under" are defined with respect to the conventional plane or surface being on the top surface of the wafer or substrate, regardless of the orientation of the wafer or substrate.

Throughout this specification the designation "n+" refers to semiconductor material that is heavily doped n-type semiconductor material, e.g., monocrystalline silicon or polycrystalline silicon. Similarly, the designation "p+" refers to semiconductor material that is heavily doped p-type semiconductor material. The designations "n–" and "p–" refer to lightly doped n and p-type semiconductor materials, respectively.

Figure 2:
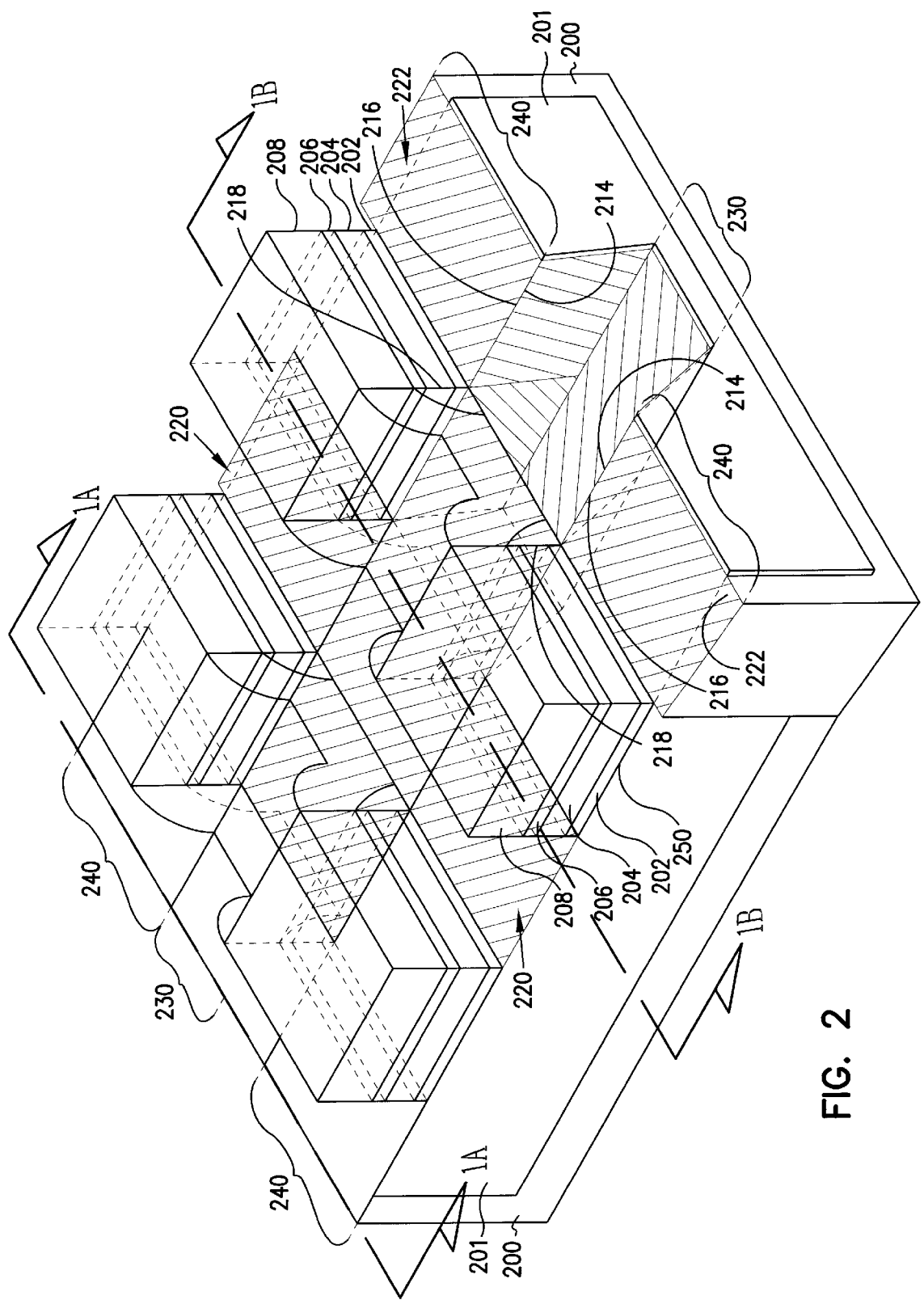
FIG. 2 is a perspective view illustrating one embodiment of an array of FLOTOX transistors as fabricated for a more complex system according to the teachings of the present invention.

FIG. 1A is a cross-sectional view, taken along cut line 1A—1A shown in FIG. 2, illustrating one embodiment of non volatile floating gate tunneling oxide (FLOTOX) transistors 50A and 50B, non volatile memory cells 50A and 50B, according to the teachings of the present invention. The FLOTOX transistor 50A is a non volatile memory cell structure which has a floating gate 104A that can be electrically programmed, erased, and reprogrammed. Flash memory is one form of non volatile memory which implements floating gates. Electronically erasable and programmable read only memories (EEPROMs) are another form. Both types are recognized by those of ordinary skill in the art. FIG. 1A illustrates that FLOTOX transistor 50A includes a body region 101 as part of a substrate 100. Substrate 100 includes bulk semiconductor starting material, semiconductor-on-insulator (SOI) starting material, or SOT material that is formed from a bulk semiconductor starting material during processing. Using bulk silicon processing techniques, the body region 101 is single crystalline silicon (Si) which has been doped with a p-type dopant to form an p-type body region. In an alternative embodiment, the body region 101 is single crystalline silicon (Si) which has been doped with an n-type dopant to form an n-type body region. The FLOTOX transistor 50A includes a first source/drain region 120A and a second source/drain region 122 which are formed in the body region 101 portion of the substrate 100. The body region 101 separates the first source/drain region 120A from the second source/drain region 122. In one embodiment the first source/drain region 120A includes a source region and the second source/drain region 122 includes a drain region. The first and second source/drain regions, 120A and 122 are formed of single crystalline silicon (Si) that has been doped with an n-type dopant to form n+ first and second source/drain regions, 120A and 122. In an alternate embodiment, the first and second source/drain regions, 120A and 122, are formed of single crystalline silicon (Si) which has been doped with p-type dopant to form a p+ first and second source/drain regions, 120 and 122A. A channel region 124A is located in the body region 101 of the substrate 100 between the first and second source/drain regions, 120A and 122. The FLOTOX transistor 50A includes electrical contacts 103 which couple to the first and second source/drain regions, 120A and 122. In one embodiment, shown in FIG. 1A, a second FLOTOX transistor 50B is located adjacent to FLOTOX transistor 50A. FLOTOX transistor 50B is similar to FLOTOX transistor 50A in sharing body region 101 and has channel region 124B and first source/drain region 120B that are substantially the same as 124A and 120A. In one embodiment, shown in FIG. 1A, FLOTOX transistors 50A and 50B share a common electrical contact 103 for second source/drain regions 122. In one embodiment, the common electrical contact 103 is a common drain 103.

The FLOTOX transistor 50A further includes an insulator layer 120a, or a tunnel oxide layer 102A, for example silicon dioxide ($SiO_2$), located on the substrate surface 150. The tunnel oxide layer 102A constitutes a first dielectric layer. The tunnel oxide layer covers the body region. In one embodiment, the tunnel oxide layer 102A extends over portions of the first and second source/drain regions, 120A and 122A respectively. The location of the tunnel oxide layer 102A on the substrate surface 150 constitutes a first interface. A first gate 104A is located on the tunnel oxide layer 102A. The first gate 104A is a first conductive layer and serves as the floating gate 104A. In one embodiment, the first gate 104A is a polysilicon layer. In one embodiment, the first gate 104A has a top surface that is non-uniform. In one embodiment, the non-uniform surface is made of hemispherical grain (HSG) polysilicon. In another embodiment, the non-uniform surface includes wings. The first gate 104A forms a second interface in combination with the tunnel oxide layer 102A. A second insulating layer 106A is positioned on top of the first gate 104A. The second insulating layer 106A constitutes a second dielectric layer. In one embodiment, the second insulating layer 106A is an oxide-nitride-oxide (ONO) stack layer. The second insulating layer 106A forms a third interface in combination with the first gate 104A. A second gate 108A is further included in the FLOTOX transistor. The second gate 108A is a second conductive layer 108A, which serves as a control gate 108A. The second gate 108A is located on the insulator layer 106A. The union between the second gate 108A and the insulator layer 106A forms a fourth interface. In one embodiment, the second gate 108A is a polysilicon layer. In one embodiment, as shown in FIG. 1A, there is a FLOTOX transistor 50B is adjacent to, and substantially the same as, FLOTOX transistor 50A with corresponding features 102B, 104B, 106B, and 108B.

Figure 1B:
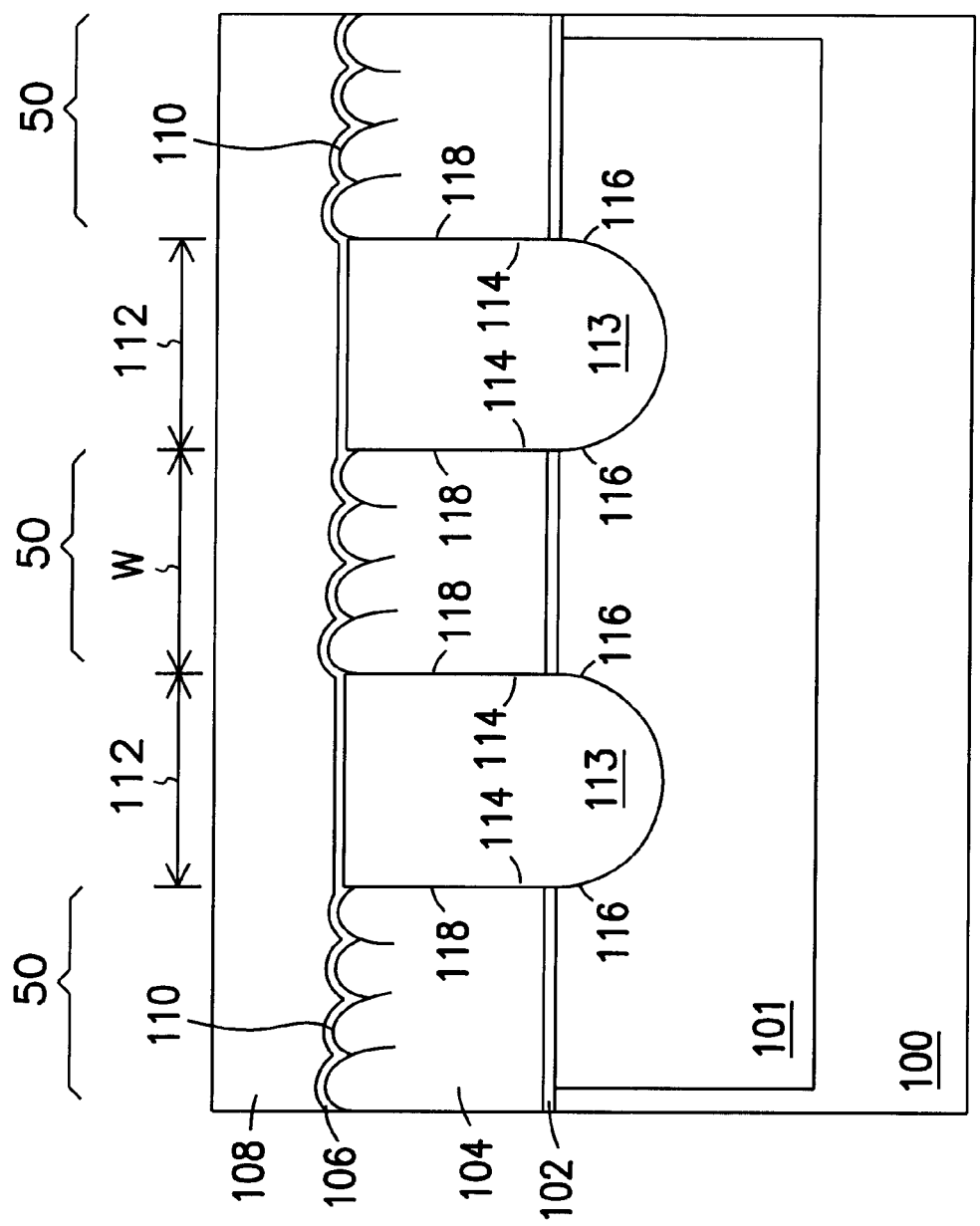
FIGS. 1B and 1C are cross-sectional views illustrating a different perspective of the embodiment of the FLOTOX transistors shown in FIG. 1A and taken along cut line 1B—1B of FIG. 2.

FIG. 1B, taken along cut line 1B—1B shown in FIG. 2, is a cross sectional view of FLOTOX transistors 50 shown in FIG. 1A according to the teachings of the present invention. FIG. 1B illustrates shallow trench isolation (STI) regions 112 and a hemispherical grain (HSG) polysilicon structure 110 of the FLOTOXs according to the teachings of the present invention. In a substrate 100, a body region 101 is included and is the same as that described above for FIG. 1A. The FLOTOXs have a first insulating layer 102, or tunnel oxide layer 102, that is on the substrate 100 surface and the body region 101. The tunnel oxide layer 102 constitutes a first dielectric layer and in one embodiment is silicon dioxide ($SiO_2$). A first gate 104 is located on the tunnel oxide layer 102 for each FLOTOX. The first gate 104 is a first conductive layer and serves as the floating gate 104. In one embodiment, the first gate 104 is a polysilicon layer. A second insulating layer 106 is positioned on top of the first gate 104. The second insulating layer 106 constitutes a second dielectric layer. In one embodiment, the second insulating layer 106 is an oxide-nitride-oxide (ONO) stack. A second gate 108 is further included in the FLOTOX transistor. The second gate 108 is a second conductive layer 108, which serves as a control gate 108. The second gate 108 is located on the second insulating layer 106. In one embodiment, the second gate 108 is a polysilicon layer.

Figure 1C:
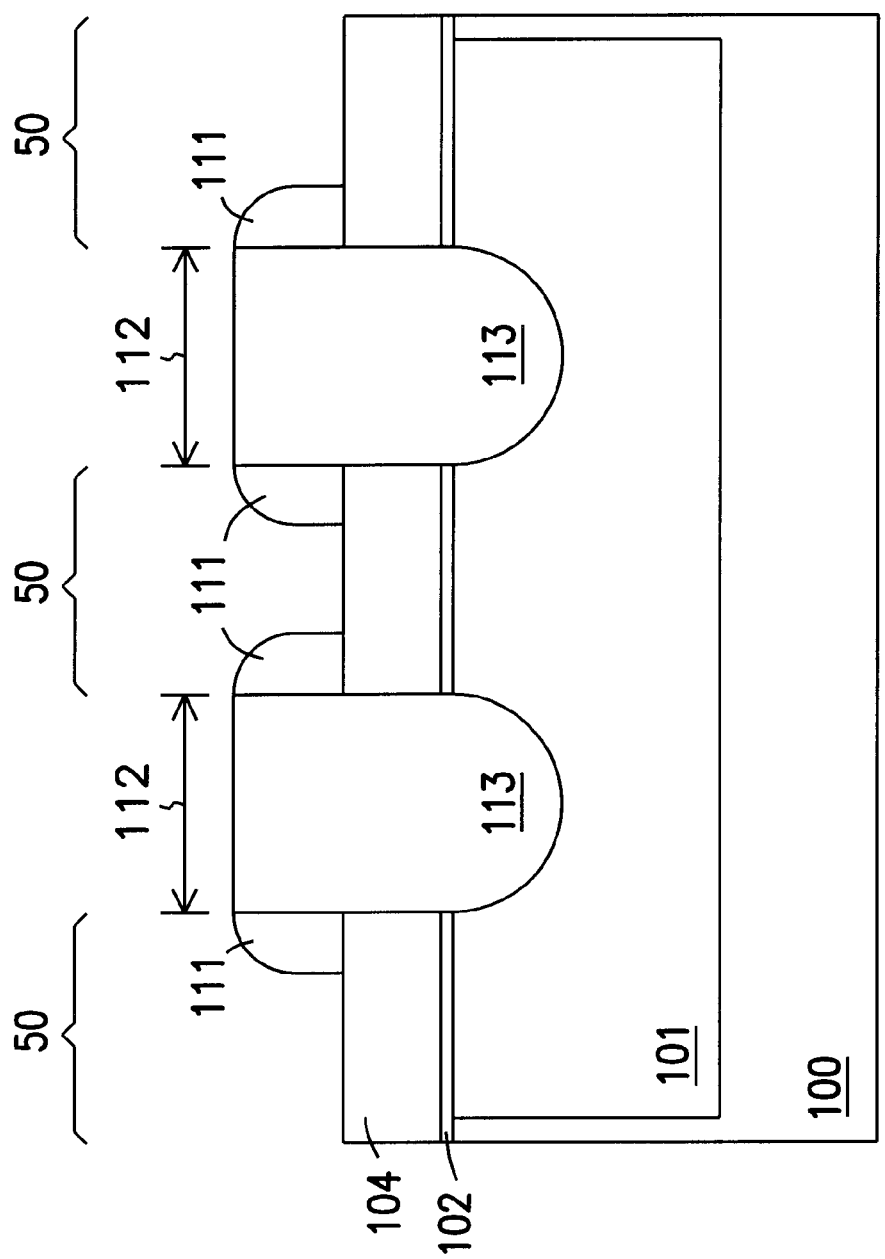

In one embodiment, the top surface of the first gate 104 is modified to increase the surface area on the top surface without increasing a width W of the first gate 104. This increase in surface area increases the gate coupling ratio (GCR) between the first gate 104 and the second gate 108. In one embodiment, the modification to the top surface of the first gate 104 includes hemispherical grain (HSG) polysilicon 110 that forms a top portion 110 and a top surface 110 of the first gate 104. The HSG polysilicon 110 increases the surface area of the top surface of the first gate 104. In another embodiment, shown in FIG. 1C, the modification to the top surface of the first gate 104 is the addition of wings 111 next to the shallow trench isolation 112. In one embodiment, the wings 111 are formed from the same material as the first gate. The wings also increase the surface area of the top surface of the first gate 104. These increases in surface area increase the gate coupling ratio (GCR) between the first gate 104 and the second gate 108.

Additionally, shallow trench isolation (STI) regions 112 are located in the body region 101 of the substrate 100 and extend to the top of the first gates 104 and are filled by a trench oxide 113. In one embodiment, the trench oxide 113 is silicon dioxide ($SiO_2$). According to the teachings of the present invention, the shallow trench isolation regions 112 include trench walls 114 which form edges 116 to the body region 101 in the substrate 100. Also, according to the teachings of the present invention, the trench walls 114 form edges 118 to the first gates 104 such that the edges 116 and edges 118 are aligned. The aligned edges allow for the individual FLOTOX device size to be reduced since the first gates 104 do not flow over the shallow trench isolation regions 112. In one embodiment, according to the teachings of the present invention, device size is less than 0.4 $\mu m^2$ thus allowing more FLOTOX devices to be formed using the same substrate 200. The novel FLOTOX structure of the present invention, thus, improves the edge profile of the floating gate polysilicon that increases data retention due to the elimination of localized tunneling at edges 116 and 118. The novel FLOTOX structure of the present invention also provides for greater erase uniformity by reducing variations due to tunnel oxide thinning at edges 116 and 118.

FIG. 2 illustrates a top angle perspective of one embodiment of an array of floating gate tunnel oxide (FLOTOX) transistors 205, or an array of memory cells 205 according to the present invention. As shown in FIG. 2, a series of first insulating layers 202 are shown on the body region 201, one for each active region 240. In one embodiment, the first insulating layers 202 are tunnel oxide layers 202 and are silicon dioxide ($SiO_2$). Each tunnel oxide layer 202, the substrate 200, and the body region 201 are substantially the same as those described in reference to FIGS 1A, 1B and 1C. On top of each tunnel oxide layer 202 is a first gate 204. In one embodiment, each first gate 204 is polysilicon. In one embodiment, the first gate 204 is a conducting layer and is a floating gate 204. In one embodiment, the top surface of the first gate 204 is modified to increase the surface area by making it non-uniform. In one embodiment, the non-uniform surface includes hemispherical grain (HSG) polysilicon as a top surface for the first gate 204, as shown in FIG. 1B. In another embodiment, wings next to the isolation trench 212 are used to increase the surface area as described in connection with FIG. 1C. A second insulating layer 206 is located on the surface of the first gate 204. In one embodiment, the second insulating layer 206 is an oxide-nitride-oxide (ONO) stack. A second gate 208 is located on top of the second insulating layer 206. In one embodiment, the second gate 208 is polysilicon. In one embodiment, the second gate 208 is a conducting layer and is a control gate.

An isolation region 230 is shown in FIG. 2 separating the active regions 220. The isolation region 230 is a shallow trench isolation (STI) region formed in the body region 201 of the substrate 200. According to the teachings of the present invention, the shallow trench isolation region 230 includes trench walls 214 which form edges 216 to the body region 201 in the substrate 200. Also, according to the teachings of the present invention, the trench walls 214 form edges 218 to the first gates 204 such that the edges 216 and edges 218 are aligned. The STI region 230 is filled with an insulator. In one embodiment, the insulator is silicon dioxide ($SiO_2$). The aligned edges allow for the individual FLOTOX device size to be reduced since the first gates 204 do not flow over the shallow trench isolation regions 230. In one embodiment, according to the teachings of the present invention, device size is less than 0.4 $\mu m^2$, thus, allowing more FLOTOX devices to be formed using the same substrate 200. The novel FLOTOX structure of the present invention, thus, improves the edge profile of the floating gate polysilicon that increases data retention due to the elimination of localized tunneling at the field isolation edge. The novel FLOTOX structure of the present invention also provides for greater erase uniformity by reducing variations due to tunnel oxide thinning at the edge of the field isolation.

The array of FLOTOXs 205 also has a series of drain regions 220 and source regions 222. In one embodiment, as shown in FIG. 2, each drain region 220 is separated and electrically isolated from adjacent drain regions 220 by the shallow trench isolation regions 230. In one embodiment, as shown in FIG. 2, all of the source regions 222 of the array of FLOTOXs 205 are coupled to each other and form a continuous source junction 222. In another embodiment, the source regions 222 of at least sixteen FLOTOX's 205 are coupled together to form a source rail 222.

While only two active regions 240 are shown in FIG. 2, one skilled in the art will recognize the repeatable structure shown and that any number of active regions 240 separated by shallow trench isolation regions 230 can be used in an array, hence, the details of a longer array are not disclosed in the present application.

Figure 3:
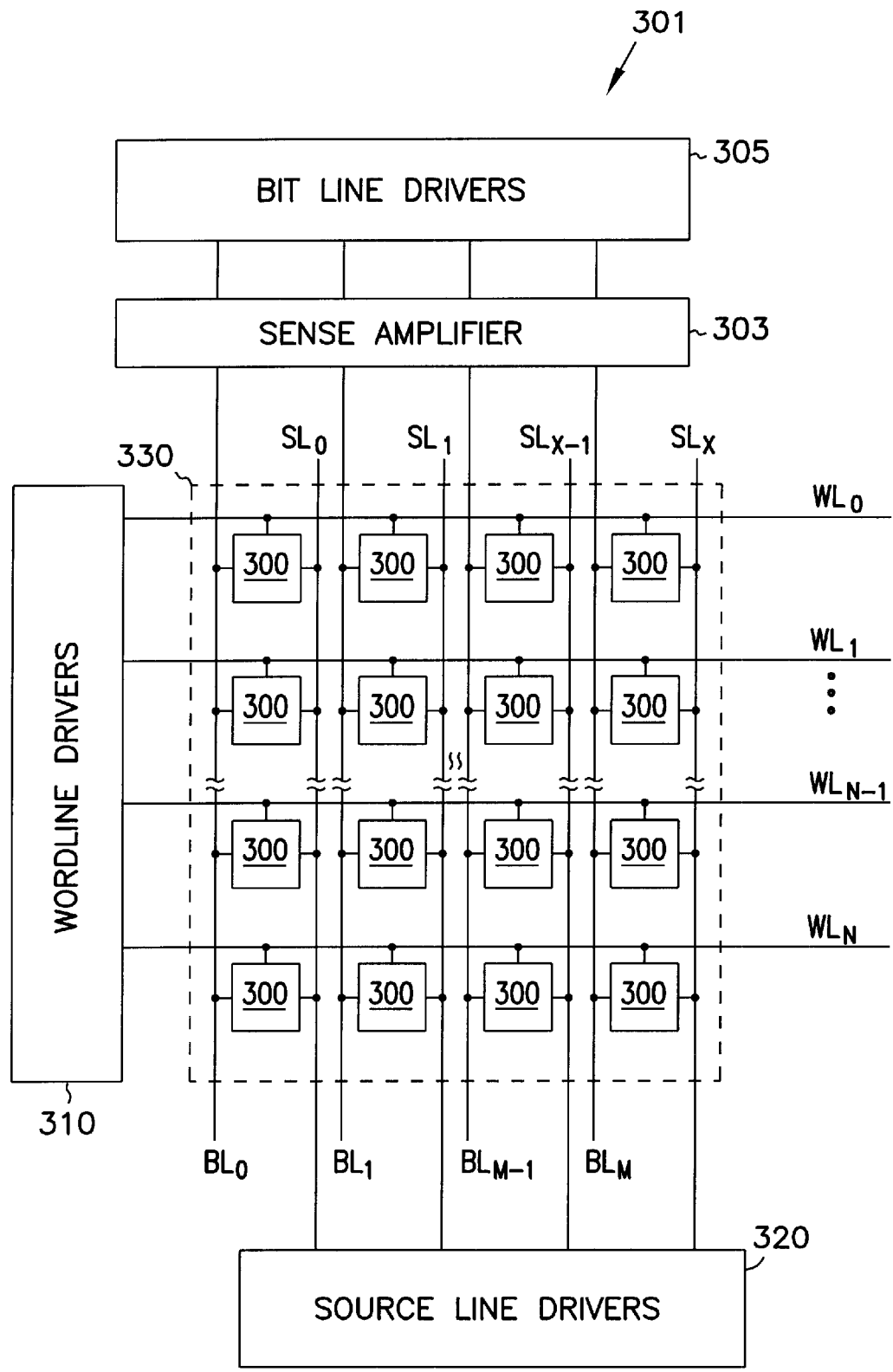
FIG. 3 is a block diagram illustrating an embodiment of a memory array according to the teachings of the present invention.

FIG. 3 is a block diagram illustrating one embodiment of a memory array of FLOTOXs 301, or memory device 301 according to the teachings of the present invention. The memory array 301 is comprised of an array of non volatile memory cells 330 which includes a number of individual FLOTOX transistors 300. Each FLOTOX transistor 300 includes the non volatile memory cell described above in conjunction with FIGS. 1A, 1B and 1C. The memory array 330 includes a number of wordlines, a number of bitlines, and a number of sourcelines. In one embodiment, there are N rows of wordlines $WL_0, WL_1 \ldots WL_{N-1}, WL_N$. Each of the N rows of wordlines couples to the second conductive layer, or control gate, for a number of FLOTOX transistors 300 in the row. In analogous fashion, array 330 has M columns of bitlines $BL_0, BL_1 \ldots BL_{M-1}, BL_M$. Each of the M columns of bitlines couples to the second source/drain region, or drain region, for a number of FLOTOX transistors 300 in the column. This embodiment further includes X columns of sourcelines $SL_0, SL_1, \ldots SL_{X-1}, SL_X$. Each of the X sourcelines couples to the first source/drain region, or source region, for a number of FLOTOX transistors 300 in the column. It should be noted the numbers represented by the variable X, M, and N may be the same or different.

The N rows of wordlines $WL_0, WL_1 \ldots WL_{N-1}, WL_N$ are coupled to wordline drivers 310 and communicate with the control gates to selectively read, program, erase, or reprogram the FLOTOX transistors 300. The M columns of bitlines are coupled to a number of sense amplifiers 303 and serve to transport bits of data information to and from the number of FLOTOX transistors 300 of the memory array 301. A number of bitline drivers 305 are coupled to the number of sense amplifiers 303. The X columns of sourcelines $SL_0, SL_1, \ldots SL_{X-1}, SL_X$ are used to couple a power supply 320 ($V_{DD}$) to the number of FLOTOX transistors 300 in the memory array 301. The read, program and unprogram operations for a non volatile memory cell, of which flash memory is one form and EEPROMS are another, are well known by those of ordinary skill in the art. The actual steps in such processes do not form part of the present invention and thus are not recited in detail here.

Figure 4:
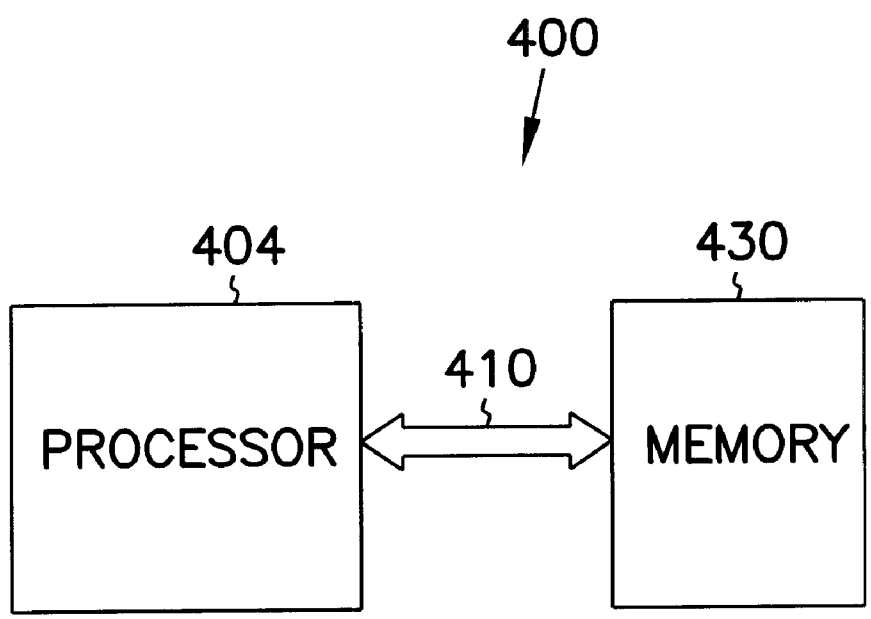
FIG. 4 is a block diagram illustrating an embodiment of an information handling system according to the teachings of the present invention.

FIG. 4 is a block diagram illustrating one embodiment of an information handling system 400 according to teachings of the present invention. FIG. 4 illustrates that information handling system 400 includes a memory array of FLOTOXs 430, or memory device 430. The memory 430 includes the memory array including the novel FLOTOX structure provided and described above in connection with FIG. 3. The information handling system 400 further includes a processor 404. The processor 404 couples to the memory 430 via a bus 410. Processors 404 and buses 410 are well known to those of ordinary skill in the art. These processors 404 and buses 410 are commercially available in many suitable forms for implementation with the present invention. Those skilled in the art will recognize and be able to employ such suitable devices with the present invention. As such, a detailed description of these processors 404 and buses 410 is not provided here.

FIGS. 5A–5F illustrate an embodiment of a process of fabrication for a non volatile floating gate tunneling oxide (FLOTOX) transistor, or non volatile memory cell, according to the teachings of the present invention. The standard FLOTOX transistor includes a source, a drain, and a body region all formed within a substrate. The body region separates the source and drain regions. These regions are covered by a tunnel dielectric. A floating gate is located on the tunnel dielectric. Further, a control gate is located on the floating gate. A second dielectric layer is interposed between and separates the control gate and the floating gate. Standard FLOTOX transistor formation, of this sort, is generally known by those of ordinary skill in the art. Therefore, for succinctness, FIGS. 5A–5F illustrate only the manner in which the floating gate and shallow trench isolation are formed and other relevant steps surrounding this formation without specific details as to how this region is mask defined or how other portions of the wafer are protected using standard materials and methods.

Figure 5A:
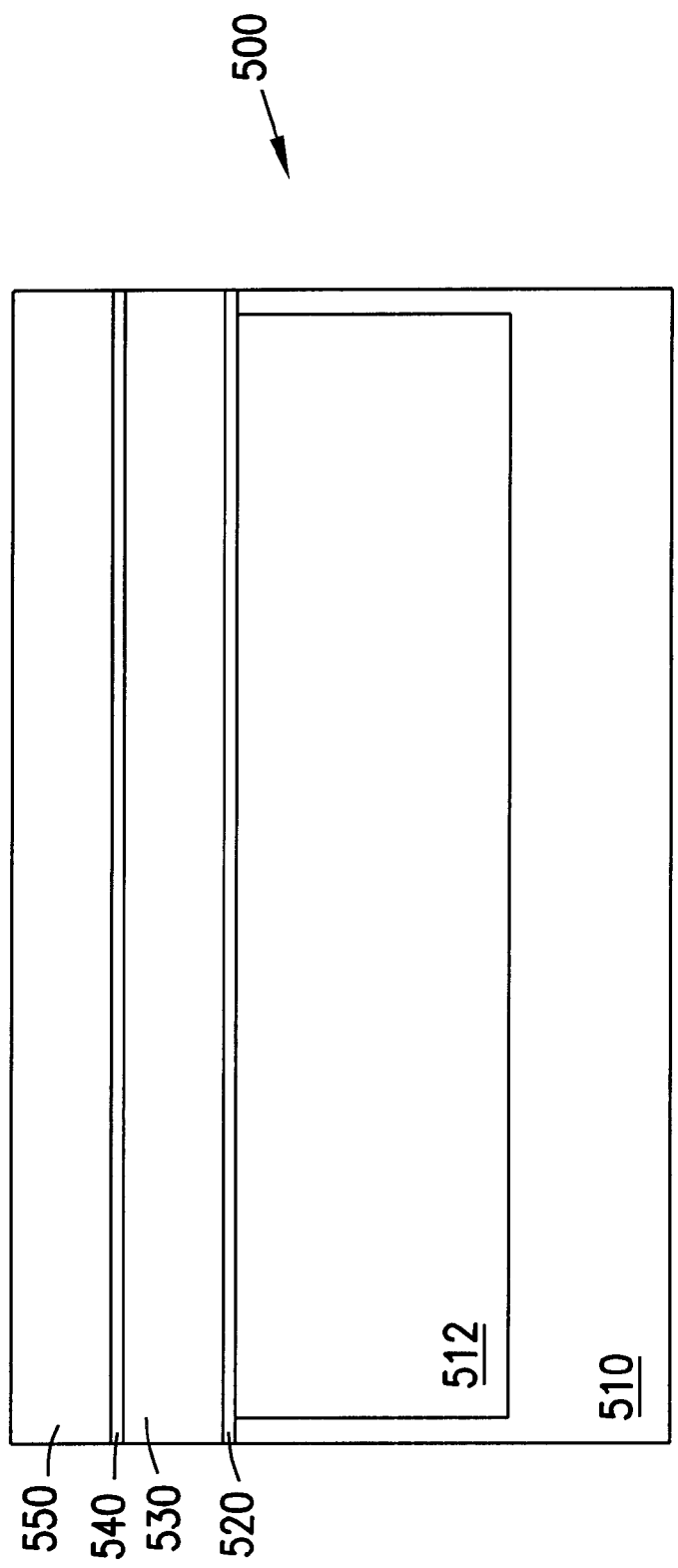

FIG. 5A illustrates the structure after the following series of processing steps. A first insulating layer 520 is formed on the surface of substrate 510. In one embodiment, the substrate 510 is single crystalline silicon (Si) which has been doped with p-type dopant to form an p-type body region 512, or p-well 512. In this embodiment, the substrate 510 has been doped with p-type dopant to form p+ source/drain regions. In another embodiment, the substrate 510 is single crystalline silicon (Si) which has been doped with a n-type dopant to form a n–type body region 512, or n-well 512. In this embodiment, the substrate 510 has been doped with an n– type dopant to form a n+ source/drain regions. In one embodiment the first insulating layer 520 is a tunnel oxide layer and is formed on the body region 512. The tunnel oxide layer 520 is deposited to an appropriate thickness for the type of FLOTOX transistor desired. In one example, if the FLOTOX is of the flash memory type, the oxide layer 520 will typically have a thickness of less than 120 Angstroms (Å). If, however, the FLOTOX is of the electronically erasable and programmable read only memory (EEPROM) type the tunnel oxide layer 510 will typically have a thickness of 150 Å or greater. In another embodiment, the first insulating layer is 85 Å to 120 Å thick, e.g. 105 Å thick. In one embodiment, the first insulating layer 520 is $SiO_2$. In one embodiment, the first insulating layer 520 is formed through thermal oxidation by exposing the substrate 510 to oxygen at a temperature between 750 C. and 1200 C., preferably at a temperature of 800 C. for 1 hour. In another embodiment, the first insulating layer 520 is formed by exposing the substrate 510 to oxygen plus water vapor at a temperature between 750 C. and 1200 C., e.g. at a temperature of 800 C. for 1 hour. Next, a first conducting layer 530 is formed on the first insulating layer. In one embodiment, the first conducting layer 530 is a first gate. In another embodiment, the first conducting layer 530 is a floating gate. In one embodiment, the first conducting layer 530 is a polysilicon layer 530. In one embodiment, the first conducting layer 530 is between 300 Å and 2000 Å thick, e.g. about 900 Å thick. In one embodiment, the polysilicon layer 530 is formed through decomposition of $SiH_4$ at a temperature between 525 C. and 650 C., e.g. 625 C. A pad oxide layer 540 is then formed on the first conducting layer 530. In one embodiment, the pad oxide layer 540 is $SiO_2$. In one embodiment, the pad oxide layer 540 is 50 Å to 200 Å thick, e.g. about 100 Å thick. In one embodiment, the pad oxide layer 540 is formed through thermal oxidation by exposing the conducting layer 530 to oxygen at a temperature between 750 C. and 1200 C., e.g. at a temperature of 800 C. for 1 hour. In another embodiment, the pad oxide layer 540 is formed by exposing the conducting layer 530 to oxygen plus water vapor at a temperature between 750 C. and 1200 C., e.g. at a temperature of 800 C. for 1 hour. A nitride layer 550, e.g. $Si_3N_4$, is formed on the pad oxide layer 540. In one embodiment, the nitride layer is 500 Å to 2000 Å thick, e.g. about 900 Å thick. In one embodiment, the nitride layer 550 is formed by depositing nitride using the chemical process $3SiH_4+4NH_3 \rightarrow Si_3N_4+12H_2$ at a temperature between 650 C. and 900 C., e.g. 700 C. The structure is now as it appears in FIG. 5A.

Figure 5B:
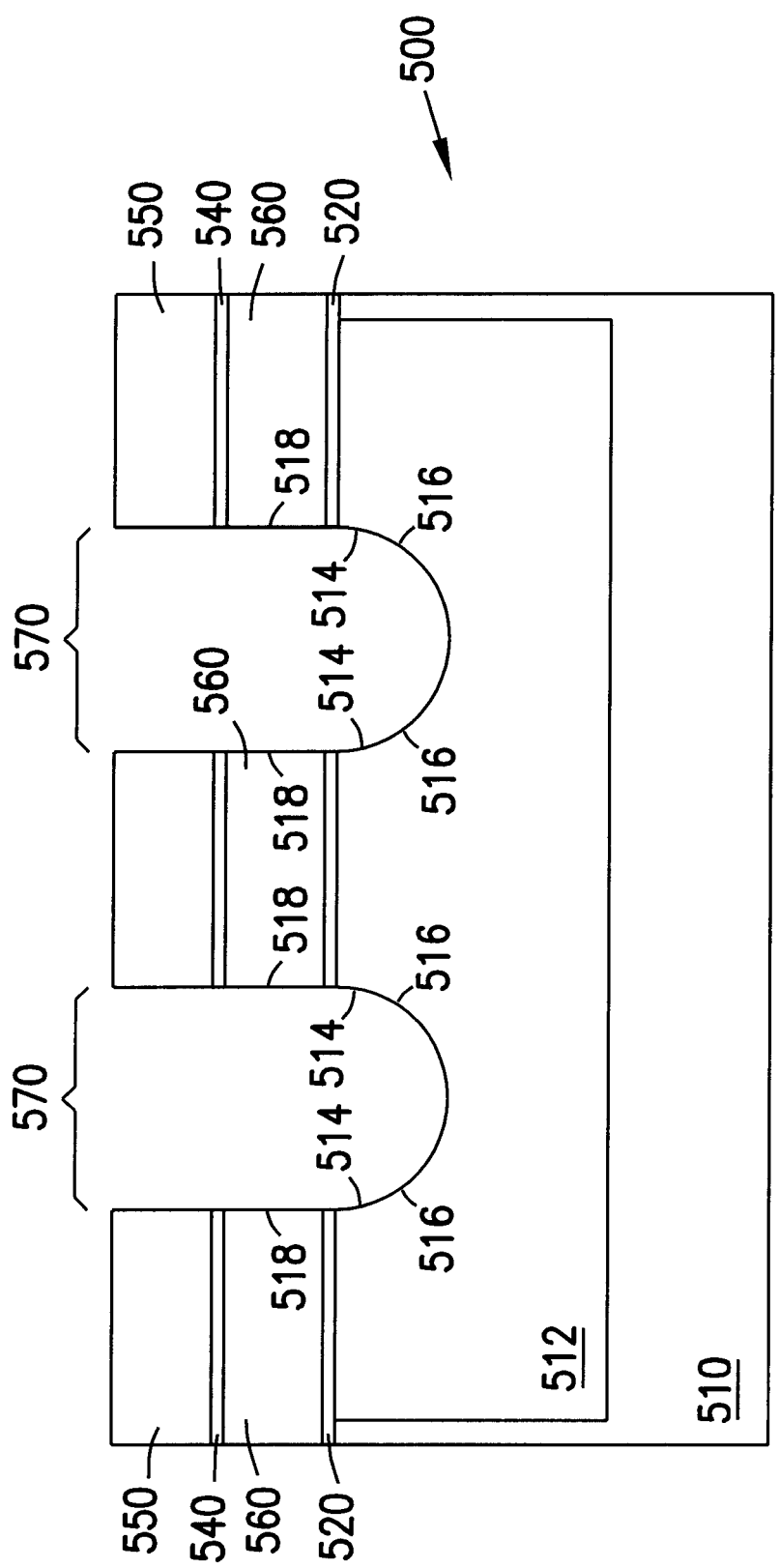

FIG. 5B illustrates the structure after the next series of processing steps. Shallow trench isolation (STI) regions 570 and floating gates 560 are formed. In one embodiment the STI regions 570 and floating gates 560 are formed through etching. To form the STI regions 570 and floating gates 560, the nitride layer 550, pad oxide layer 540, first conducting layer 530, first insulating layer 520 and substrate 510 are etched. The etching can again be done through any suitable method, such as wet chemical etching or dry etching. In one embodiment, the shallow trench isolation regions 570 are etched to a depth in the substrate of between 1000 Å and 5000 Å, e.g. about 3000 Å. According to the teachings of the present invention, etching the STI regions 570 and floating gates 560 creates trench walls 514 that form edges 516 to body region 512 in substrate 510. Also, according to the teachings of the present invention, trench walls 514 form edges 518 to floating gates 560 such that edges 516 and edges 518 are aligned. The aligned edges allow for the individual FLOTOX transistor size to be reduced since floating gates 560 do not flow over STI regions 570. In one embodiment, according to the teachings of the present invention, the FLOTOX device is formed to a size less than 0.4 $\mu m^2$, thus, allowing more FLOTOX devices to be formed using the same substrate 510. Additionally, floating gates 560 and shallow trench isolation regions 570 are defined in a single step lithography process, e.g. photolithography. This single step creates a structure where edges 518 of floating gates 560 and edges 516 of STI regions 570 are self-aligned. The structure is now as shown in FIG. 5B.

Figure 5C:
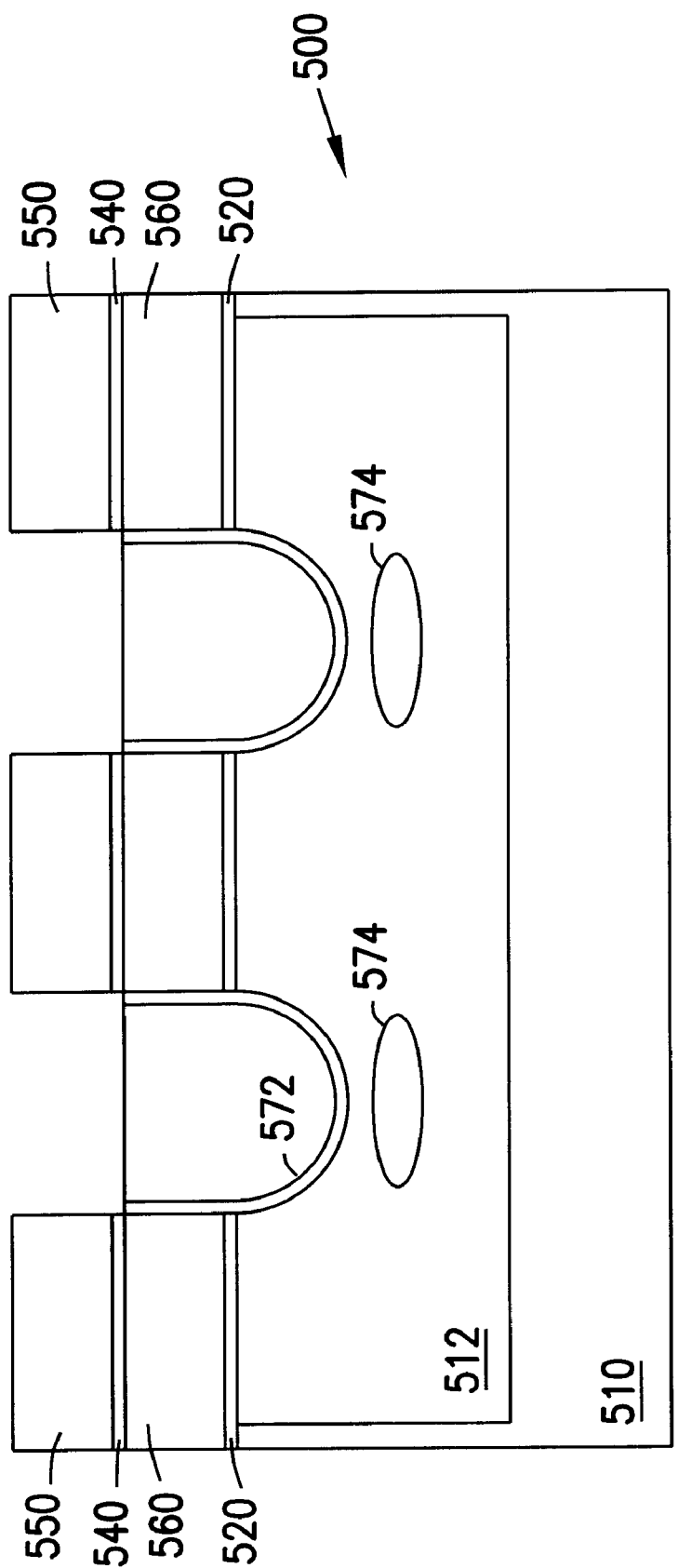

FIG. 5C shows the structure after the next sequence of processing steps. Oxide liners 572 are formed on shallow trench isolation regions 570 and the edges 518 of floating gates 560. In one embodiment, the oxide liners 572 are $SiO_2$. In one embodiment, oxide liners 572 are formed to a thickness of between 50 Å and 600 Å, e.g. 150 Å. In one embodiment, the oxide liner 572 is formed through thermal oxidation by exposing the structure to oxygen at a temperature between 750 C. and 1200 C., e.g. at a temperature of 1050 C. for 18 minutes. In another embodiment, oxide liners 572 are formed by exposing the structure to oxygen plus water vapor at a temperature between 750 C. and 1200 C., e.g. at a temperature of 1050 C. for 18 minutes. Next, isolation fields 574 are formed in substrate 510 below shallow trench isolation regions 570. In one embodiment, the isolation fields 574 contains 5e11 to 5e12 ions/$cm^2$, e.g. 1.7e12 ions/$cm^2$. The structure is now as shown if FIG. 5C.

Figure 5D:
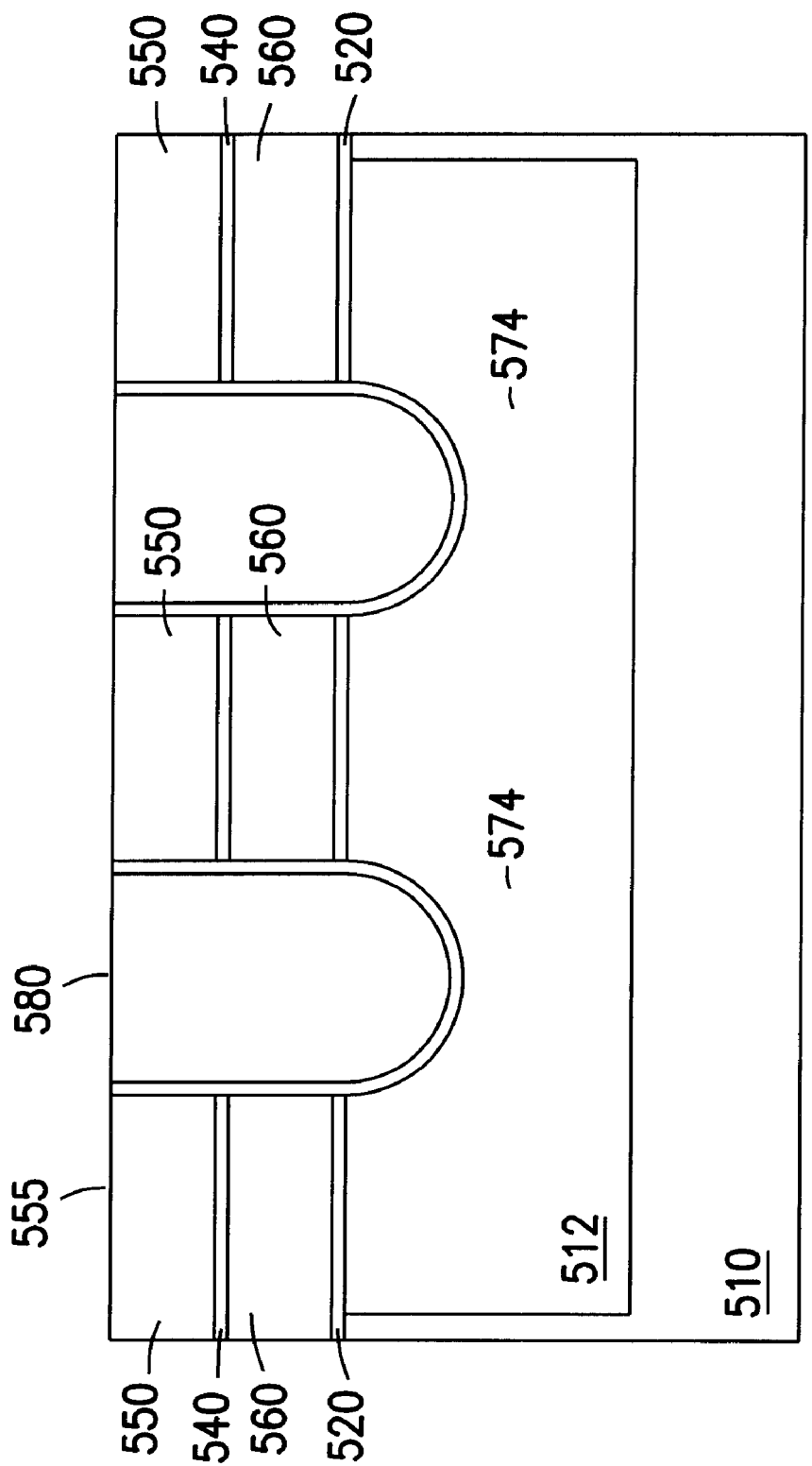

FIG. 5D illustrates the structure after the next sequence of processing steps. Trench oxides 580 are formed in shallow trench isolation regions 570. In one embodiment, trench oxides 580 are $SiO_2$. Trench oxides 580 are formed through any suitable process, such as chemical vapor deposition (CVD). In one embodiment, trench oxides 580 are formed to a thickness between 2000 Å to 1000 Å, e.g. 6500 Å. Next, upper surfaces 555 of the structure are planarized to nitride layers 550. In one embodiment, upper surfaces 555 are planarized through the process of chemical mechanical polishing/planarization (CMP). CMP is well known in the art and is, therefore, not described in detail here. The structure is now as shown is FIG. 5D.

Figures 1, 5E:
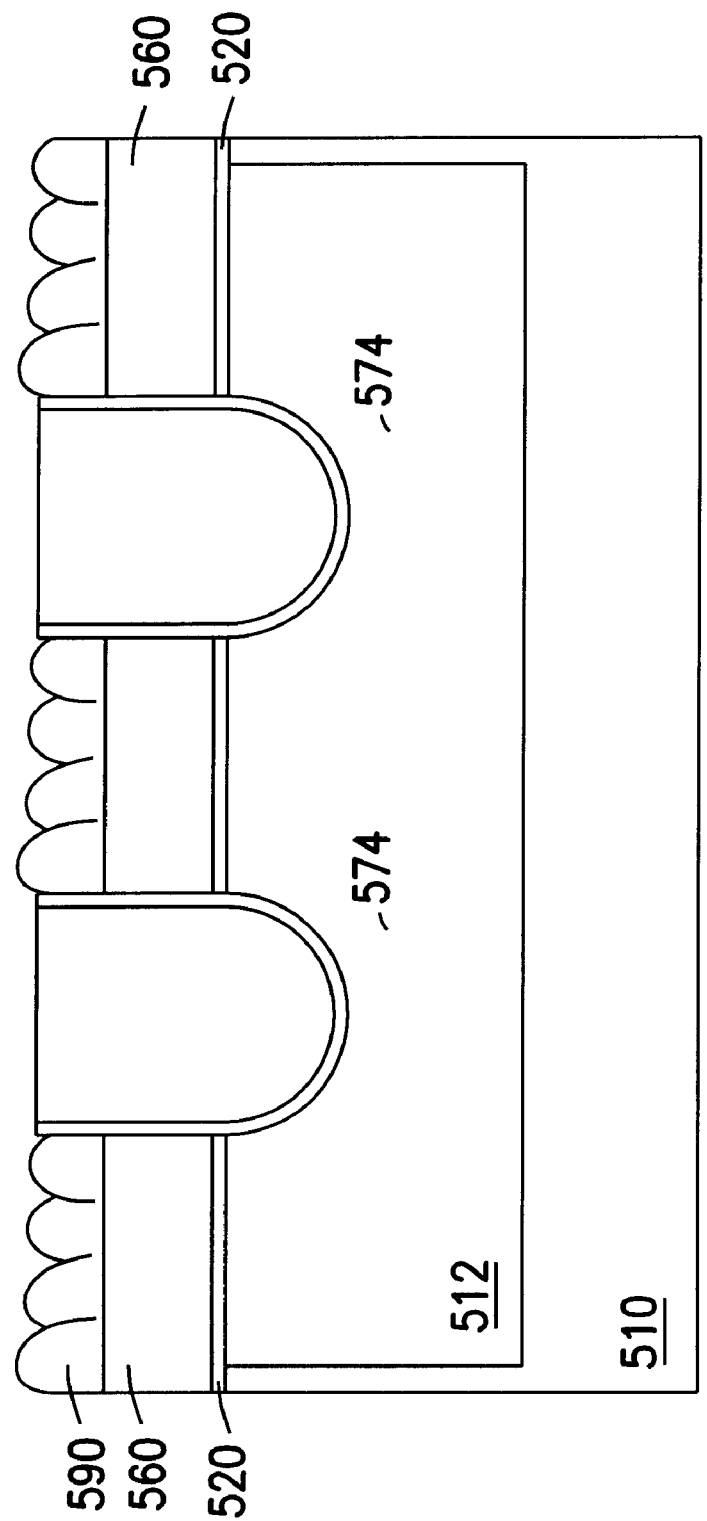
Figures 2, 5E:
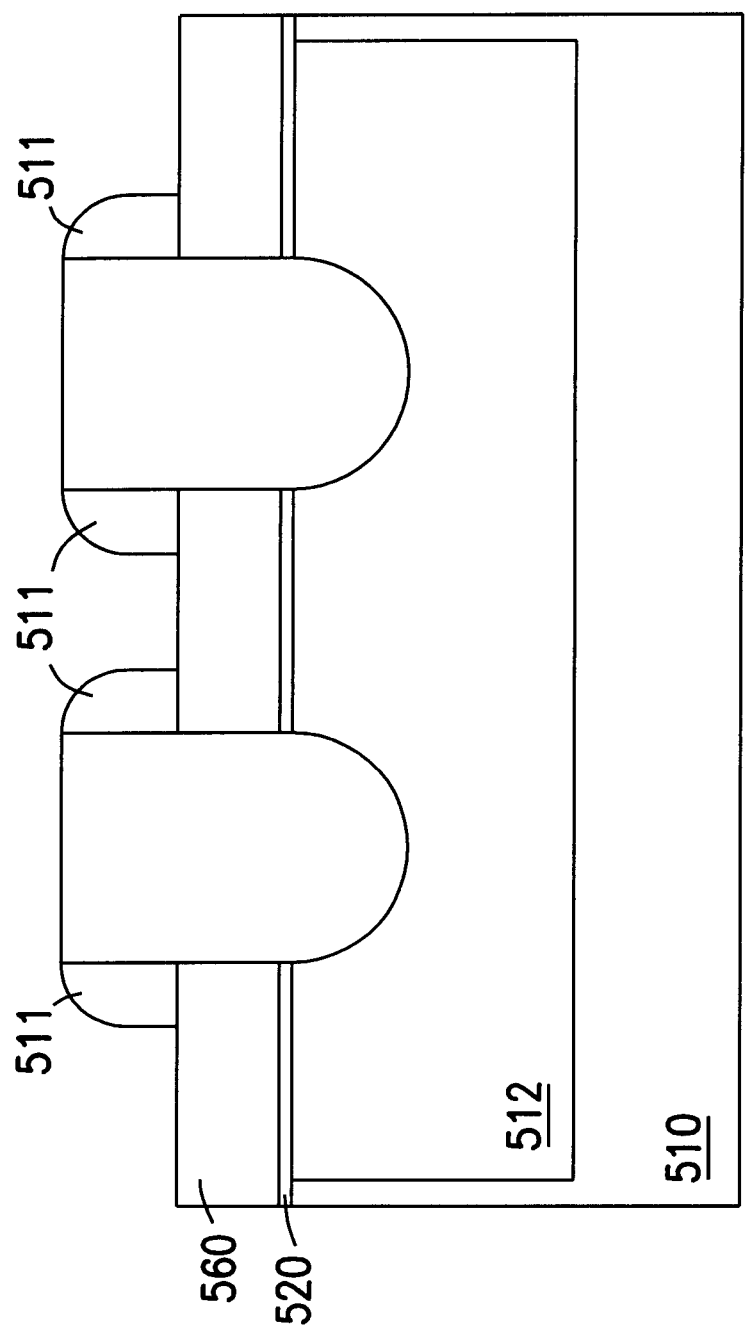

FIGS. 5E-1 and 5E-2 represents the structure following the next sequence of processing steps. Nitride layer 550 is removed. In one embodiment, nitride layers 550 is removed using $H_3PO_4$ at 140 C. to 180 C. Next, pad oxide layer 540 is removed. Pad oxide layer 540 is removed using any suitable process, such as using a solution of HF and $H_2O$ in a ratio of 25:1, $H_2O$:HF. In one embodiment, the surface area of the top surface of the first conducting layer 530 is increased. In one embodiment, shown in FIG. 5E-1, the surface area is increased using hemispherical grain (HSG) polysilicon layers 590 selectively formed on the floating gates 560. In one embodiment, the HSG polysilicon layers 590 are formed through low pressure chemical vapor deposition (LPCVD) by decomposition of $SiH_4$ at a temperature between 525 C. and 650 C., e.g. about 570 C. In another embodiment, shown in FIG. 5E-2 the surface area is increased using conducting wings formed on floating gates 560. In one embodiment, the conducting wings are formed by depositing a blanket layer of polysilicon on floating gates 560 and etching the newly formed layer back to form the conducting wings. The blanket layer of poly-silicon can be deposited using any suitable deposition process, such as chemical vapor deposition (CVD). The blanket layer can be etched through any suitable etching process, such as wet chemical etching or dry etching. The increased surface area of the top surface of the floating gates 560 results in an improved gate coupling ratio (GCR). The structure 500 is now as it appears in FIGS. 5E-1 and 5E-2.

Figure 5F:
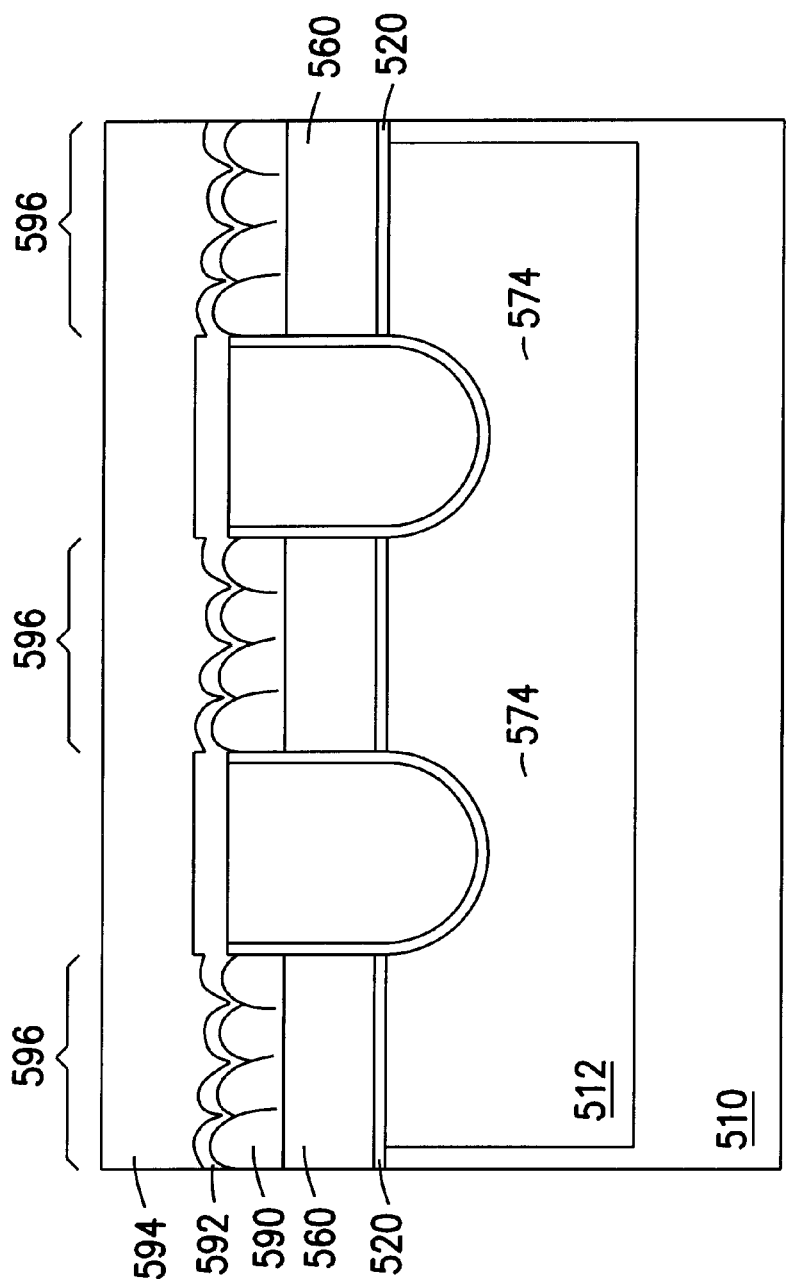

FIG. 5F illustrates the structure after the next sequence of processing steps. Second insulating layers 592 are formed on HSG polysilicon layers 590 and trench oxides 580. In one embodiment, second insulating layers 592 are Oxide-Nitride-Oxide (ONO) stacks. In one embodiment, the first oxide layers of the ONO stacks are $SiO_2$. In one embodiment, first oxide layers of the ONO stacks are between 25 Å and 60 Å thick, e.g. 35 Å thick. In one embodiment, first oxide layers of the ONO stacks are formed by exposing substrate 500 to oxygen at a temperature between 750 C. and 1200 C., e.g. about 800 C. for 1 hour. In one embodiment, the nitride layers of the ONO stacks are $Si_3N_4$. In one embodiment, the nitride layers of the ONO stacks are between 30 Å and 150 Å thick. In one embodiment, the nitride layers of the ONO stacks are 100 Å thick. In another embodiment, the nitride layers of the ONO stacks are 50 Å thick. In one embodiment, the nitride layers of the ONO stacks are formed by depositing nitride using the chemical process $3SiH_4+4NH_3 \rightarrow Si_3N_4+12H_2$ at a temperature between 650 C. and 900 C., e.g. 700 C. In another embodiment, the nitride layers of the ONO stacks are formed by CVD. In one embodiment, the second oxide layers of the ONO stacks are formed through thermal oxidation of the nitride layers of the ONO stacks by exposing the nitride layers to oxygen plus water vapor at a temperature between 850 C. and 1200 C., e.g. about 950 C. for 41 minutes. In another embodiment, the second oxide layers of the ONO stacks are formed through deposition of $SiO_2$. The $SiO_2$ is deposited through any suitable process, such as CVD.

Next, second conducting layers 594 are formed. In one embodiment, second conducting layers 594 are second gates 594 or control gates 594. In one embodiment, second conducting layers 594 are polysilicon. In one embodiment, second conducting layers 594 are formed to a thickness between 500 Å and 2000 Å, e.g. about 1500 Å. In one embodiment, second conducting layers 594 are formed by Low Pressure Chemical Vapor Deposition (LPCVD) through decomposition of $SiH_4$ at a temperature between 525 C. and 650 C., e.g. about 625 C. The structure is now as it appears in FIG. 5F.

The structure in FIG. 5F shows the floating gates 560, HSG polysilicon layers 590, and edges of the body region 516 formed by the trench walls 514 of the STI regions 570 have been self-aligned according to the teachings of the present invention. This self-alignment allows for a reduction in the overall size of the FLOTOX cells 596 to less than 0.4 $\mu m^2$. In one embodiment, shown in FIG. 5F, the use of HSG polysilicon makes up for any loss in Gate Coupling Ratio (GCR) between floating gates 560 and second conducting layers 594, due to this reduction in size. In another embodiment, shown in FIG. 5E–2, the loss in GCR is made up by using wings on the floating gates 560. Additionally, the novel self-aligned FLOTOX structure of the present invention improves the edge profile of the floating gates 560 which correspondingly increases data retention due to the elimination of localized tunneling at the edges of the STI regions 570. The novel FLOTOX structure of the present invention also provides for greater erase uniformity by reducing variations due to tunnel oxide thinning at the edges of the STI regions 570.

The remaining processing steps for completing the FLOTOX transistor follow conventional methods. These methods are well known by those practiced in the art of semiconductor fabrication. Contact holes and wiring for wordlines, bitlines, and sourcelines are achieved through conventional processing steps. One skilled in the art will recognize the method to these steps and, hence, they are not disclosed as part of this application.

Conclusion

Thus, a method and structure for an improved floating gate memory cell has been provided. Thus, the present invention capitalizes on a single step process for defining shallow trench isolation (STI) regions and floating gates that aligns the edges of each with the other. This alignment allows for a significant reduction in the size of each memory cell that correspondingly increases the density of memory cells in a particular area of a memory system. The alignment also facilitates an improved edge profile of the floating gate polysilicon that correspondingly increases data retention due to the elimination of localized tunneling at the field isolation edge. Additionally, the alignment provides for greater erase uniformity by reducing variations due to tunnel oxide thinning at the edge of the field isolation uniformity.

The present invention also employs techniques to increase the area of the top side of the floating gate. The area increase is needed to compensate for the loss in area due to the reduced size of the memory cell which correspondingly reduces the gate coupling ratio (GCR) between the floating gate and the control gate. The techniques include using hemispherical grain (HSG) polysilicon or wings on the top surface of the floating gate. Either HSG polysilicon or wings will increase the surface area of the top side of the floating gate. The increased area maintains or improves the GCR between the floating gate and the control gate of the memory cell, thus, allowing the memory cell to function at reasonable signal levels.

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. It is to be understood that the above description is intended to be illustrative, and not restrictive. The scope of the invention includes any other applications in which the above structures and fabrication methods are used. The scope of the invention should be determined with reference to the appended claims, along with the full scope of equivalents to which such claims are entitled.

What is claimed is:

1. A method for fabricating a non volatile memory cell, comprising:

forming a tunnel oxide layer on a substrate;

forming a first conducting layer on the tunnel oxide layer;

forming a shallow trench isolation region having walls that form edges in the substrate and form edges in the first conducting layer wherein the edges of the first conducting layer are aligned with the edges of the substrate and wherein the shallow trench isolation region isolates the non volatile memory cell;

forming an insulating layer on the first conducting layer;

forming a second conducting layer on the insulating layer; and wherein fabricating the non volatile memory cell comprises fabricating the non volatile memory cell to a size less than 0.4 $\mu m^2$.

2. The method of claim 1, wherein forming the first conducting layer includes forming a non-uniform top surface on the first conducting layer.

3. The method of claim 1, wherein forming the non-uniform top surface includes forming a hemispherical grain (HSG) polysilicon.

4. The method of claim 1, wherein forming the non-uniform top surface includes forming wings adjacent to the shallow trench isolation region.

5. The method of claim 1, wherein forming the shallow trench isolation region includes forming a floating gate.

6. The method of claim 1, wherein forming the shallow trench isolation region comprises:

defining the floating gate and the shallow trench isolation using a single lithographic process; and etching the first conducting layer, the tunnel oxide layer and the substrate.

7. The method of claim 1, wherein forming the first conducting layer comprises forming a layer of polysilicon.

8. The method of claim 1, wherein forming the second conducting layer comprises forming a control gate.

9. The method of claim 1, wherein forming the second conducting layer comprises forming a layer of polysilicon.

10. A method for fabricating an array of floating gate tunnel oxide (FLOTOX) transistors, comprising:

forming a number of FLOTOX transistors, wherein forming a FLOTOX transistors comprises:

forming a first insulating layer on a substrate, wherein the substrate includes a source region, a drain region and a body region separating the source region and the drain region and wherein the first insulating layer is formed on the body region;

forming a floating gate on the first insulating layer having a top surface, wherein the top surface is non-uniform;

forming a shallow trench isolation region having walls that form edges in the body region and edges to the floating gate such that the edges of the floating gate are aligned with the edges of the body region and wherein the shallow trench isolation region isolates the FLOTOX transistor;

forming a second insulating layer on the floating gate; and forming a control gate on the second insulating layer; coupling all of the source regions of the number of FLOTOX transistors together; and wherein the drain regions of the number of FLOTOX transistors are isolated from each other by the shallow trench isolation regions, and wherein forming the number of FLOTOX transistors further comprises forming at least one of the number of FLOTOX transistors to have an area that is less than 0.4 $\mu m^2$.

11. The method of claim 10, wherein forming the first insulating layer of at least one of the number of FLOTOX transistors comprises forming a tunnel oxide layer.

12. The method of claim 10, wherein forming the first insulating layer of at least one of the number of FLOTOX transistors comprises forming a layer of silicon dioxide ($SiO_2$).

13. The method of claim 10, wherein forming the second insulator layer of at least one of the number of FLOTOX transistors comprises forming an oxide-nitride-oxide (ONO) stack.

14. The method of claim 10, wherein the non-uniform top surface of the floating gate of at least one of the number of FLOTOX transistors includes hemispherical grain (HSG) polysilicon.

15. The method of claim 10, wherein the non-uniform top surface of the floating gate of at least one of the number of FLOTOX transistors includes wings adjacent to the shallow trench isolation region.

16. A method for fabricating a memory device comprising:
   forming a number of FLOTOX transistors, wherein forming a FLOTOX transistors comprises:
      forming a tunnel oxide layer on a substrate, wherein the substrate includes a source region, a drain region and a body region separating the source region and the drain region;
      forming a floating gate on the tunnel oxide layer having a top surface, wherein the top surface is non-uniform;
      forming a shallow trench isolation region having walls that form edges in the body region such that the edge of the floating gate is aligned with one of the edges of the body region and wherein the shallow trench isolation region isolates the FLOTOX transistor;
      forming an insulating layer on the floating gate; and
      forming a control gate on the insulating layer;
   forming a sourceline coupled to the source region of each of the number of FLOTOX transistors;
   forming at least one wordline coupled to at least one control gate of the number of FLOTOX transistors; and
   wherein forming the number of FLOTOX transistors further comprises forming at least one of the number of FLOTOX transistors to have an area that is less than 0.4 $\mu m^2$.

17. The method of claim 16, the method further comprising forming at least one bitline coupled to at least one drain region of the number of FLOTOX transistors.

18. The method of claim 16, the method further comprising forming at least one sense amplifier each sense amplifier coupled to a select number of the at least one bitlines.

19. The method of claim 16, wherein forming the number of FLOTOX transistors includes forming a number of flash memory cells.

20. The method of claim 16, wherein the non-uniform top surface of the floating gate of at least one of the number of FLOTOX transistors includes wings adjacent to the shallow trench isolation region.

21. A method for fabricating a non volatile memory cell, comprising:
   forming a tunnel oxide layer on a substrate;
   forming a first conducting layer on the tunnel oxide layer;
   aligning edges of the first conduction layer with edges of the substrate forming an insulating layer on the first conducting layer;
   forming an insulating layer on the first conducting layer;
   forming a second conducting layer on the insulating layer; and
   fabricating the non volatile memory cell to a size of less than 0.4 $\mu m^2$.

22. The method of claim 21 wherein in aligning comprises, forming a shallow trench isolation region having walls that form the edges of the first conducting layer and the edges of the substrate.

23. The method of claim 22 wherein in forming the shallow trench isolation region isolates the non volatile memory cell.

24. A method of fabricating a non volatile memory cell, comprising:
   forming a tunnel oxide layer on a substrate, wherein the tunnel oxide layer includes a first conducting layer and a second conduction layer;
   forming an insulating layer on the first conducting layer;
   forming a floating gate in a shallow trench region by using a single lithographic process, wherein the shallow trench region includes walls that form edges in the substrate and form edges in the first conducting layer; and
   fabricating the non volatile memory cell to a size less than 0.4 $\mu m^2$.

25. The method of claim 24 wherein in forming the floating gate comprises, etching the first conductive layer, the tunnel oxide layer, and the substrate.

26. The method of claim 24 wherein in forming the tunnel oxide layer comprises, forming a control gate with the second conducting layer.

27. A method for fabricating an array of floating gate tunnel oxide (FLOTOX) transistors comprising:
   forming a number of FLOTOX transistors, wherein forming a FLOTOX transistors comprises:
      forming a tunnel oxide layer on a substrate having a source region and a drain region with a body region separating the source region and the drain region;
      forming a floating gate on a first insulating layer;
      aligning an edge of the floating gate with one edge of the body region in shallow trench that isolates the FLOTOX transistor;
      forming a second insulating layer on the floating gate, wherein the second insulating layer includes a control gate;
   coupling the source regions of the number of FLOTOX transistors together, and wherein the drain regions of the number of FLOTOX transistors are isolated from each other by shallow trench isolation regions; and
   forming at least one of the number of FLOTOX transistors to have an area that is less than 0.4 $\mu m^2$.

28. The method of claim 27 wherein in aligning comprises, forming the shallow trench regions that have walls that form in the body regions.

29. The method of claim 27 wherein in forming the floating gate, the floating gate includes a non-uniform top surface and has wings adjacent to the floating gate's shallow trench region.

30. A method for fabricating a memory device comprising:
   forming a number of FLOTOX transistors, wherein forming a FLOTOX transistors comprises:
      forming a tunnel oxide layer on a substrate having a source region and a drain with a body region separating the source region and the drain region;
      forming a floating gate on the tunnel oxide layer with a non-uniform top surface;
      aligning an edge of the floating gate with one edge of the body region within a shallow trench isolation region that isolates the FLOTOX transistor;

forming an insulating layer on the floating gate and a control gate on the insulating layer; and forming a sourceline coupled to the source region of each of the number of FLOTOX transistors;

forming at least one wordline coupled to at least one control gate of the number of FLOTOX transistors; and wherein forming the number of FLOTOX transistors further comprises forming at least one of the number of FLOTOX transistors to have an area that is less than 0.4 $\mu m^2$.

31. The method of claim 30 wherein in aligning comprises, forming the shallow trench isolation region with walls that form in the body region.

32. The method of claim 30 wherein in forming the floating gate, the non-uniform top surface of the floating gate of at least one of the number of FLOTOX transistors includes wings adjacent to the shallow trench isolation region.

* * * * *

UNITED STATES PATENT AND TRADEMARK OFFICE
CERTIFICATE OF CORRECTION

PATENT NO. : 6,566,195 B2
DATED : May 20, 2003
INVENTOR(S) : Paul J. Rudeck

It is certified that error appears in the above-identified patent and that said Letters Patent is hereby corrected as shown below:

Title page,
Item [56], References Cited, OTHER PUBLICATIONS, delete "F" before "STI".

Column 2,
Line 50, delete "the" before "these".

Column 3,
Line 11, delete "than" and insert -- then -- therefor.

Column 5,
Line 61, delete "SOT" and insert -- SOI -- therefor.

Column 11,
Line 44, delete "if" after "shown" and insert -- in -- therefor.
Line 51, delete "1000" and insert -- 10000 -- therefor.

Signed and Sealed this

Twenty-third Day of September, 2003

JAMES E. ROGAN
*Director of the United States Patent and Trademark Office*